(12) United States Patent
Chen et al.

(10) Patent No.: US 10,236,762 B2
(45) Date of Patent: Mar. 19, 2019

(54) COMMON-STATOR MACRO/MICRO INTEGRATED PRECISION MOTION ONE-DIMENSIONAL LINEAR MOTOR ASSEMBLY

(71) Applicant: GUANGDONG UNIVERSITY OF TECHNOLOGY, Guangzhou (CN)

(72) Inventors: Xin Chen, Guangzhou (CN); Zhijun Yang, Guangzhou (CN); Youdun Bai, Guangzhou (CN); Jian Gao, Guangzhou (CN); Hanxiong Li, Guangzhou (CN); Haidong Yang, Guangzhou (CN); Yisheng Guan, Guangzhou (CN); Xindu Chen, Guangzhou (CN)

(73) Assignee: GUANGDONG UNIVERSITY OF TECHNOLOGY, Guangzhou (CN)

( * ) Notice: Subject to any disclaimer, the term of this patent is extended or adjusted under 35 U.S.C. 154(b) by 128 days.

(21) Appl. No.: 15/375,178

(22) Filed: Dec. 12, 2016

(65) Prior Publication Data
US 2017/0126112 A1     May 4, 2017

Related U.S. Application Data

(63) Continuation of application No. PCT/CN2015/095411, filed on Nov. 24, 2015.

(30) Foreign Application Priority Data

Nov. 26, 2014 (CN) .......................... 2014 1 0696217

(51) Int. Cl.
*H02K 41/02* (2006.01)
*B23Q 1/44* (2006.01)
(Continued)

(52) U.S. Cl.
CPC ............... *H02K 41/02* (2013.01); *B23Q 1/44* (2013.01); *B23Q 5/28* (2013.01); *H01L 41/09* (2013.01); *H02K 11/22* (2016.01)

(58) Field of Classification Search
CPC ........ H02K 41/02; H02K 11/22; H01L 41/09; B23Q 1/44; B23Q 1/445; B23Q 1/262
(Continued)

(56) References Cited

U.S. PATENT DOCUMENTS 4,234,175 A     11/1980  Sato et al.
4,667,139 A     5/1987   Hirai et al.
(Continued)

*Primary Examiner* — Michael Andrews
(74) *Attorney, Agent, or Firm* — W&K IP (Wayne & King)

(57) ABSTRACT

A common-stator macro/micro integrated precision motion one-dimensional linear motor assembly, includes a base, linear guide rails, slide blocks, a U-shaped linear motor stator, a macro motion rotor, a micro motion rotor and a macro/micro integrated platform. A macro and micro motion platforms are connected to form an integrated platform through an elastic member, an outer frame of the macro/micro integrated platform is mounted on the linear guide rails and the slide blocks, the U-shaped linear motor stator is arranged on the base, rotors are respectively mounted on the macro and micro motion platforms, and large-scale overall high-speed motion can be realized when macro and micro rotors are simultaneously driven, and when a motion deviation occurs, the micro motion platform realizes precise displacement output by virtue of elastic deformation due to small inertia and zero friction, and high-frequency motion deviation compensation can be realized by virtue of individual drive.

10 Claims, 5 Drawing Sheets

(51) Int. Cl.
  *B23Q 5/28* (2006.01)
  *H02K 11/22* (2016.01)
  *H01L 41/09* (2006.01)

(58) Field of Classification Search
  USPC .......... 310/12.06, 12.13, 12.15, 12.19, 12.31
  See application file for complete search history.

(56) References Cited

U.S. PATENT DOCUMENTS

| | | | | |
|---|---|---|---|---|
| 5,302,873 | A * | 4/1994 | Takei | H02K 41/033 |
| | | | | 310/12.19 |
| 2005/0184618 | A1* | 8/2005 | Lee | H02K 41/0354 |
| | | | | 310/273 |
| 2008/0012431 | A1* | 1/2008 | Williams | H02K 41/03 |
| | | | | 310/12.06 |
| 2017/0087677 | A1* | 3/2017 | Yang | B23Q 1/25 |
| 2018/0104779 | A1* | 4/2018 | Yang | H02K 41/02 |

* cited by examiner

COMMON-STATOR MACRO/MICRO INTEGRATED PRECISION MOTION ONE-DIMENSIONAL LINEAR MOTOR ASSEMBLY

CROSS-REFERENCE TO RELATED APPLICATION

This application is a continuation of International Patent Application No. PCT/CN2015/095411 with a filing date of Nov. 24, 2015, designating, the United States, now pending, and further claims priority to Chinese Patent Application No. 201410696217.0 with a filing date of Nov. 26, 2014. The content of the aforementioned application, including any intervening amendments thereto, are incorporated herein by reference.

TECHNICAL FIELD

The present disclosure relates to a precision motion platform, and in particular to a common-stator macro/micro integrated precision motion one-dimensional linear motor assembly.

BACKGROUND OF THE PRESENT INVENTION

With the progress of science and, technology, people's requirements for products are higher and higher, causing that manufacturers increasingly improve the requirement for product processing precision. A travel of a high-precision feed motion platform in the existing device is short generally, while precision of an ordinary large-travel macro motion device cannot meet actual needs. The manufacturing cost of products will be greatly increased if a special large-travel high-precision motion device is adopted. With respect to the current situation, a multidirectional motion platform, capable of integrating large-travel general-precision macro motion and high-precision small-travel micro motion so as to realize large-travel high-precision feed, is more and more popular in the industry.

SUMMARY OF PRESENT INVENTION

An objective of the present disclosure is to propose a common-stator macro/micro integrated precision motion one-dimensional linear motor assembly, so that large-travel high-precision feed of one-dimensional macro/micro motion is realized by adopting a common stator.

In order to achieve the objective, the following technical solutions are provided:

A common-stator macro/micro integrated precision motion one-dimensional linear motor includes a base, a macro outer frame and a micro motion platform; the macro outer frame and the micro motion platform form an integrated platform, the micro motion platform is arranged inside the macro outer frame and includes a core platform used for placing workpieces and an elastic piece group used for position limiting, and the core platform is connected to the macro outer frame by virtue of the elastic piece group, guide rails, slide blocks and a U-shaped linear motor are arranged on the base, the slide blocks can slide on the guide rails, the U-shaped linear motor includes a stator, macro outer frame rotors, a micro motion platform rotor and connecting pieces, and the stator is shared by the macro outer frame rotors and the micro motion platform rotor, the macro outer frame is fixedly mounted on the slide blocks and connected to the macro outer frame rotors by virtue of two of the connecting pieces, and the macro outer frame rotors, the micro motion platform rotor and the stator control the macro outer frame to slide on the guide rails so as to realize the macro motion; the core platform is fixed on the micro motion platform rotor by virtue of another one of the connecting pieces, and micro motion of the core platform on the stator is controlled by the micro motion platform rotor.

As is further illustrated, the macro outer frame rotors are respectively placed at two ends of a feed direction of the macro outer frame.

As is further illustrated, the elastic piece group, the core platform and the macro outer frame are of an integral structure.

As is further illustrated, two sides of the core platform are connected with inner walls of the macro outer frame by virtue of the elastic piece group, the elastic piece group is arranged in parallel, and a length direction of the elastic piece group is perpendicular to a motion direction of the core platform.

As is further illustrated, a groove is formed in a joint of the macro outer frame and the elastic piece group, so that a thin deformable elastic part is formed in the inner side of the macro outer frame, and a frequency adjusting mechanism capable of adjusting deformation degree of the elastic part is arranged on the macro outer frame.

As is further illustrated, the frequency adjusting, mechanism is a bolt penetrating through the groove, and, two ends of the bolt are respectively connected to two sides of the groove.

As is further illustrated, the frequency adjusting mechanism further includes a piezoelectric ceramic piece, and the piezoelectric ceramic piece is mounted on the outer side of the groove by virtue of the bolt.

As is further illustrated, the micro motion platform further includes a displacement sensor arranged at an end part of a feed direction of the core platform.

As is further illustrated, the displacement sensor is a differential capacitance sensor or a photoelectric sensor.

As is further illustrated, an insulating layer is arranged on a non-working surface of the displacement sensor.

The present disclosure proposes a common-stator macro/micro integrated precision motion one-dimensional linear motor assembly, including a base, linear guide rails, slide blocks, a U-shaped linear motor stator, a macro motion rotor, a micro motion rotor and a macro/micro integrated platform. A macro motion platform and a micro motion platform are connected to form an integrated platform by virtue of an elastic component, an outer frame of the macro/micro integrated platform is mounted on the linear guide rails and the slide blocks, the U-shaped linear motor stator is arranged on the base, rotors are respectively mounted on the macro motion platform and the micro motion platform, and large-scale overall high-speed motion can be realized when macro and micro rotors are simultaneously driven. When a motion deviation occurs, the micro motion platform realizes precise displacement output by virtue of elastic deformation due to small inertia and zero friction, and high-frequency motion deviation compensation can be realized by virtue of individual drive. Due to composite motion control, one-dimensional high-speed precision motion can be realized. The installation and use method is consistent with that of the traditional platform, and the one-dimensional platform is convenient to popularize and use.

The present disclosure has the beneficial effects that: 1, due to macro/micro integration, one-dimensional large-travel high-precision feed motion is realized; 2, the stator is fixed on a rack, so that motion inertia of the micro motion platform is reduced, and response speed of the one-dimensional micro motion platform is increased; and 3, since the common stator is adopted, the structure is simple and the platform stability is high.

DETAILED DESCRIPTION OF PREFERRED EMBODIMENTS

Figure 1:
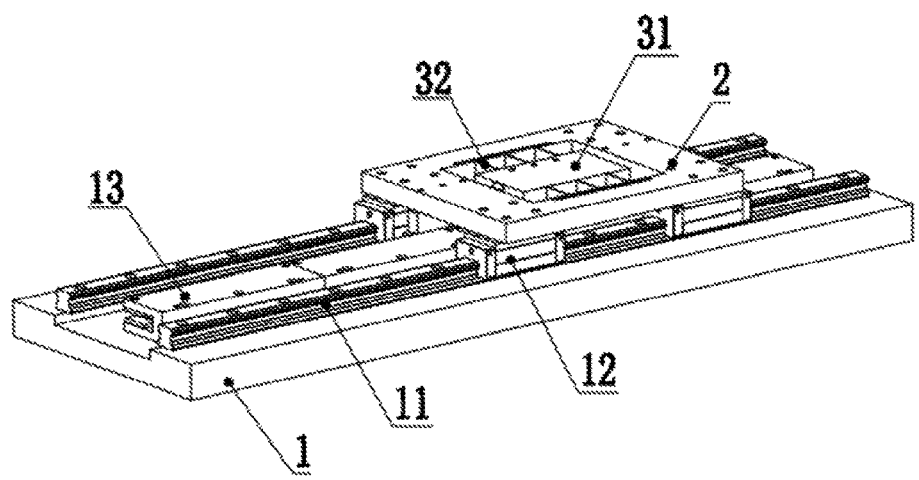
FIG. 1 is a structural diagram showing an embodiment of the present disclosure.
Figure 2:
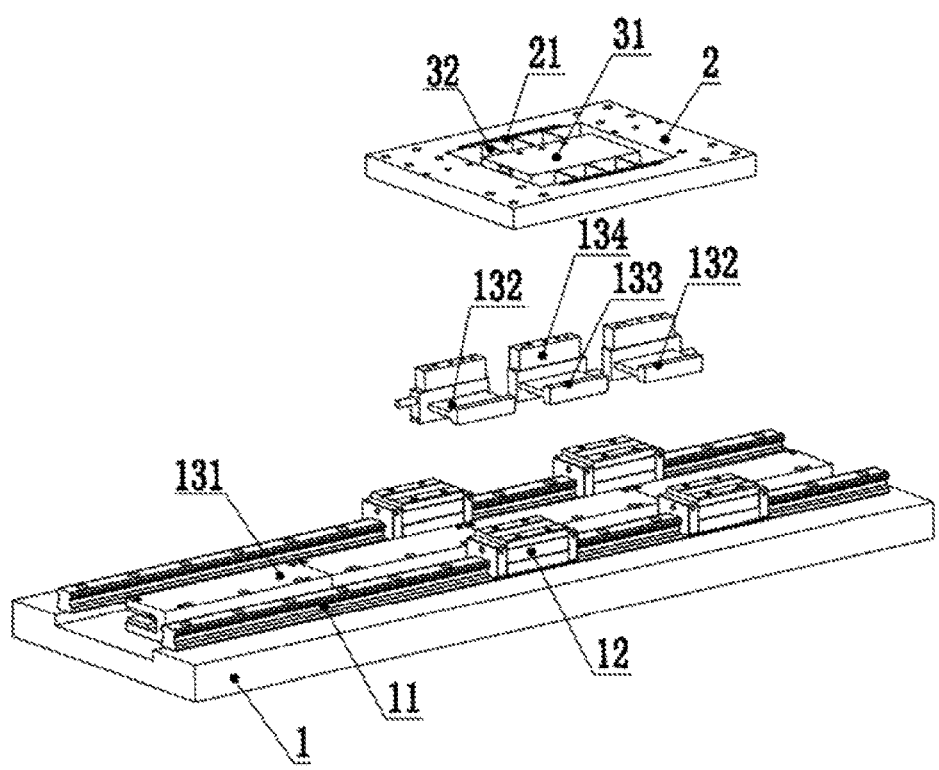
FIG. 2 is a structural diagram showing an embodiment of the present disclosure.
Figure 3:
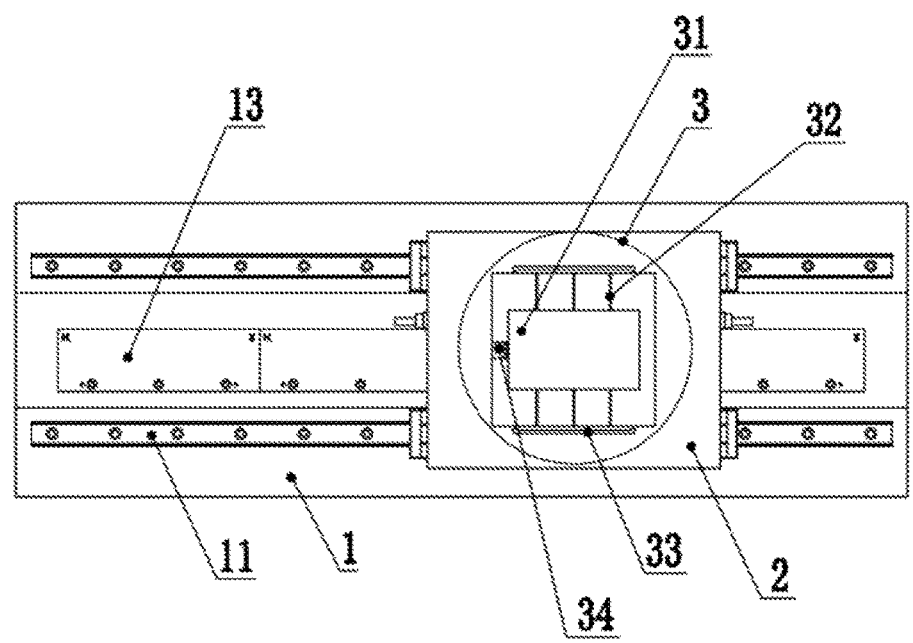
FIG. 3 is a top view showing an embodiment of the present disclosure.
Figure 4:
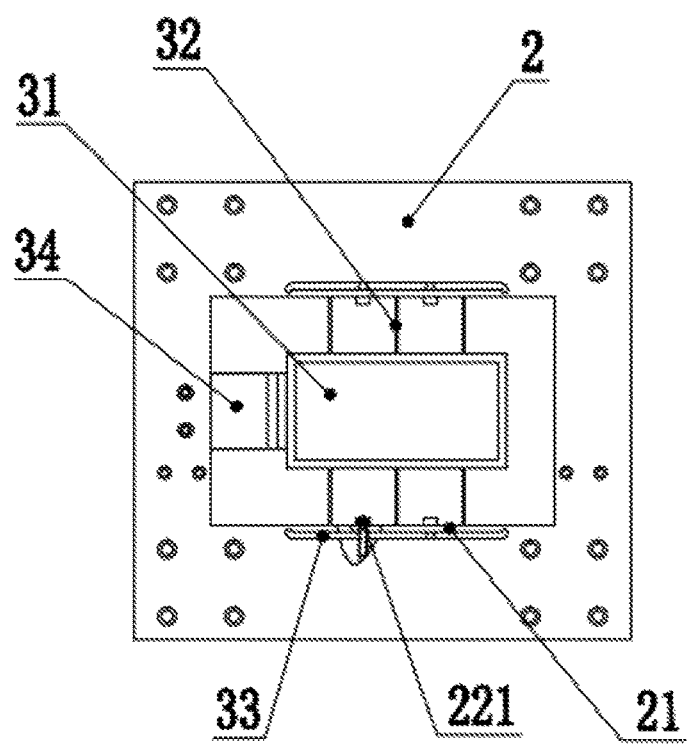
FIG. 4 is a structural diagram showing an integrated platform in an embodiment of the present disclosure.
Figure 5:
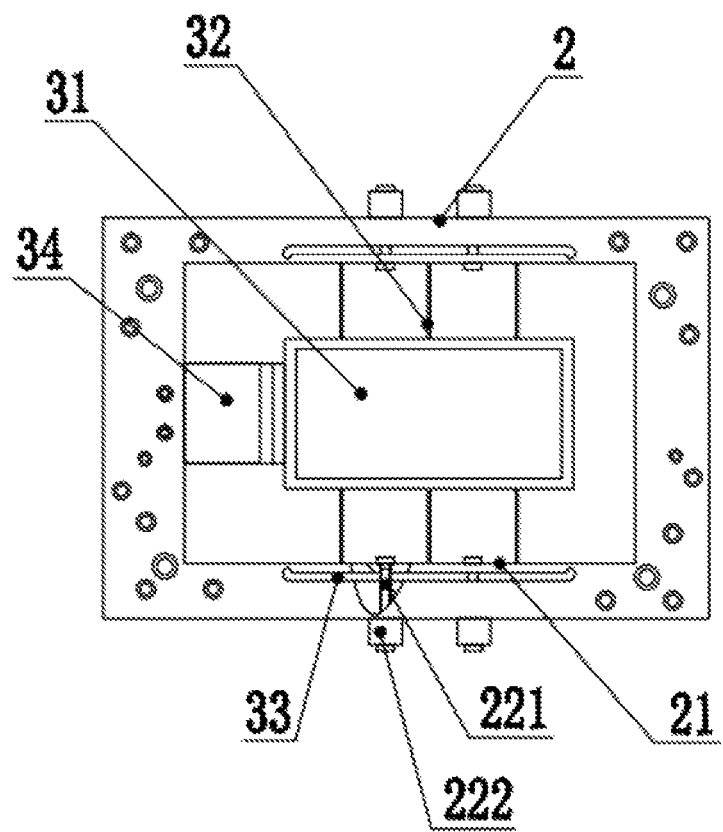
FIG. 5 is a structural diagram showing an integrated platform in an embodiment of the present disclosure, In the figures: base 1, macro outer frame 2, micro motion platform 3, core platform 31, elastic piece group 32, guide rail 11, slide block 12, U-shaped linear motor 13, stator 131, macro outer frame rotors 132, micro motion platform rotor 133, connecting piece 134, groove 33, displacement sensor 34, elastic part 21, frequency adjusting mechanism 22, bolt 221 and piezoelectric ceramic piece 222.

The technical solutions of the present disclosure will be further described below with reference to the accompanying drawings, in which exemplary embodiments of the disclosure are shown.

A common-stator macro/micro integrated precision motion one-dimensional linear motor assembly includes a base 1, a macro outer frame 2 and a micro motion platform 3.

The macro outer frame 2 and the micro motion platform 3 form an integrated platform, the micro motion platform 3 is arranged inside the macro outer frame 2 and includes a core platform 31 used for placing workpieces and an elastic piece group 32 used for position limiting, and the core platform 31 is connected to the macro outer frame 2 by virtue of the elastic piece group 32.

Guide rails 11, slide blocks 12 and a U-shaped linear motor 13 are arranged on the base 1, the slide blocks 12 can slide on the guide rails 11, the U-shaped linear motor 13 includes a stator 131, macro outer frame rotors 132, a micro motion platform rotor 133 and a connecting piece 134, and the stator 131 is shared by the macro outer frame 2 and the micro motion platform rotor 133.

The macro outer frame 2 is fixedly mounted on the slide blocks 13 and connected to the macro outer frame rotors 132 by virtue of the connecting piece 134, and the macro outer frame rotors 132, the micro motion platform rotor 133 and the stator 131 control the macro outer frame to slide on the guide rails 11 so as to realize the macro motion.

The core platform 31 is fixed on the micro motion platform rotor 133 by virtue of the connecting, piece 134, and micro motion of the core platform on the stator 131 is controlled by the micro motion platform rotor 133.

One-dimensional macro/micro motion is realized based on the U-shaped linear motor 13, and the advantages of large-travel motion range, small inertia and high response speed can be realized, including large-travel adjustment of macro motion of the macro outer frame 2 and further including precision positioning of the micro motion platform 3 in micro motion, so that the common-stator macro/micro integrated precision motion one-dimensional linear motor assembly in the present disclosure can be precisely moved and positioned in a wide range. A controller transmits a displacement instruction to the macro outer frame 2 and the micro motion platform 3. Due to an integrated design of the macro outer frame 2 and the micro motion platform 3, the macro outer frame 2 together with the micro motion platform 3 moves to an expected position under the drive of the macro outer frame rotors 132 and the micro motion platform rotor 133. A plurality of rotors are arranged to provide power for realizing a high-speed motion. The higher the provided driving force is, the higher the load capacity is. The controller transmits a signal to the micro motion platform rotor 133 when the micro motion platform 3 reaches the expected position. The micro motion platform 3 is driven to actively compensate displacement fluctuation of the macro outer frame 2 relative to the expected position in real time until a workpiece placed on the core platform 31 reaches the expected position, and then high dynamic precision of the common-stator macro/micro integrated precision motion one-dimensional linear motor assembly is realized. The stator 131 is shared by the macro outer frame rotors 132 and the micro motion platform rotor 133, macro/micro motion of different travels can be realized by arranging only one U-shaped linear motor 13. The structure is hence simple, and the platform is acceptable to more enterprises. The macro outer frame 2 and the micro motion platform 3 form an integrated platform, and the platform is made of a whole material by virtue of such manners as milling, electrosparking and the like, thereby avoiding assembling errors of parts and improving the motion precision of the platform.

As is further illustrated, the macro outer frame rotors 132 are respectively placed at two ends of a feed direction of the macro outer frame 2. The micro motion platform 3 is arranged in the middle of the macro outer frame. Therefore, the two macro outer frame rotors 132 are respectively arranged at two ends of the feed direction of the macro outer frame 2, so that the macro outer frame 2 is more balanced in stress, faster in response and more stable.

As is further illustrated, the elastic piece group 32, the core platform 31 and the macro outer frame 2 are of an integral structure. An integrated design of the macro outer frame 2 and the micro motion platform 3 is compact in structure and is made of a whole material by virtue of such manners as milling, electrosparking and the like, thereby avoiding the assembling errors of the parts and improving the motion precision of the platform.

As is further illustrated, two sides of the core platform 31 are connected with inner walls of the macro outer frame 2 by virtue of the elastic piece group 32, the elastic piece group 32 is arranged in parallel, and a length direction of elastic pieces is perpendicular to a motion direction of the core platform 31. One-dimensional motion of the core platform 31 is effectively limited by the elastic piece group 32 arranged in parallel, and the motion of the core platform 31 in a non-feed direction is inhibited under the constraining effect of the elastic piece group 32.

As is further illustrated, a groove 33 is formed in a joint of the macro outer frame 2 and the elastic piece group 32, so that a thin deformable elastic part 21 is formed in the inner side of the macro outer frame 2, and a frequency adjusting mechanism 22 capable of adjusting deformation degree of the elastic part 21 is arranged on the macro outer frame 2. Inherent frequency of a mechanism in the above micro motion can be changed by changing tightness of the elastic piece group 32 by virtue of the frequency adjusting mechanism 22, so that motion characteristics of the core platform 31 are changed.

As is further illustrated, the frequency adjusting, mechanism 22 is a bolt 221 penetrating through the groove 33, and two ends of the bolt are respectively connected to two sides of the groove 33. The bolt 221 is capable of manually adjusting the length direction to produce displacement, changing the deformation degree of the elastic part 21, further changing tensile force of the elastic piece group 32 and realizing dynamic adjustment of the structural inherent frequency of the platform.

As is further illustrated, the frequency adjusting mechanism 22 further includes a piezoelectric ceramic piece 222, and the piezoelectric ceramic piece 222 is mounted on the outer side of the groove 33 by virtue of the bolt 221. The piezoelectric ceramic piece 222 is capable of producing displacement in the length direction of the bolt 221 under the action of an applied voltage, changing the deformation degree of the elastic part 21, further changing the tensile force of the elastic piece group 32 and realizing dynamic adjustment of the structural inherent frequency of the platform.

As is further illustrated, the micro motion platform 3 further includes a displacement sensor 34 arranged at an end part of a feed direction of the core platform 31. The displacement sensor is used for detecting one-dimensional micro displacement of the core platform 31.

As is further illustrated, the displacement sensor 34 is a differential capacitance sensor or a photoelectric sensor. The differential capacitance sensor is small in mechanical displacement, high in precision and high in interference resistance, the photoelectric sensor has the advantages of high precision, fast response, non-contact and the like, and has simple structure and small the size, and both the differential capacitance sensor and the photoelectric sensor can serve as the displacement sensor.

As is further illustrated, an insulating layer is arranged on a non-working surface of the displacement sensor 34. The insulating layer is used for preventing a micro displacement sensor 25 from being interfered by other metal materials so as not to influence the measurement accuracy.

The technical principles of the present disclosure are described above with reference to specific embodiments. These descriptions are only used for illustrating the principles of the present disclosure, and cannot be illustrated as a limitation to the protection scope of the present disclosure in any manner. Based on the illustration herein, those skilled in the art can contemplate other specific implementation modes of the present disclosure without contributing any creative work, and these modes fall into the protection scope of the present disclosure.

We claim:

1. A common-stator macro/micro integrated precision motion one-dimensional linear motor assembly, comprising a base, a macro outer frame and a micro motion platform;

wherein, the macro outer frame and the micro motion platform form an integrated platform, the micro motion platform is arranged inside the macro outer frame and comprises a core platform used for placing workpieces and an elastic piece group, and the core platform is connected to the macro outer frame by virtue of the elastic piece group;

guide rails, slide blocks and a U-shaped linear motor are arranged on the base, the slide blocks can slide on the guide rails, the U-shaped linear motor comprises a stator, macro outer frame rotors, a micro motion platform rotor and connecting pieces, and the stator is shared by the macro outer frame rotors and the micro motion platform rotor;

the macro outer frame is fixedly mounted on the slide blocks and connected to the macro outer frame rotors by virtue of two of the connecting pieces, and the macro outer frame rotors, the micro motion platform rotor and the stator control the macro outer frame to slide on the guide rails so as to realize the macro motion, and the core platform is fixed on the micro motion platform rotor by virtue of another one of the connecting pieces, and micro motion of the core platform on the stator is controlled by the micro motion platform rotor.

2. The linear motor assembly according to claim 1, wherein the macro outer frame rotors are respectively placed at two ends of a feed direction of the macro outer frame.

3. The linear motor assembly according to claim 1, wherein the elastic piece group, the core platform and the macro outer frame are of an integral structure.

4. The linear motor assembly according to claim 1, wherein two sides of the core platform are connected with inner walls of the macro outer frame by virtue of the elastic piece group, the elastic piece group is arranged in parallel, and a length direction of the elastic pieces group is perpendicular to a motion direction of the core platform.

5. The linear motor assembly according to claim 4, wherein a groove is formed in a joint of the macro outer frame and the elastic piece group, so that a thin deformable elastic part is formed in the inner side of the macro outer frame, and a frequency adjusting mechanism capable of adjusting deformation degree of the elastic part is arranged on the macro outer frame.

6. The linear motor assembly according to claim 5, wherein the frequency adjusting mechanism is a bolt penetrating through the groove and two ends of the bolt are respectively connected to two sides of the groove.

7. The linear motor assembly according to claim 6, wherein the frequency adjusting mechanism further comprises a piezoelectric ceramic piece, and the piezoelectric ceramic piece is mounted on the outer side of the groove by virtue of the bolt.

8. The linear motor assembly according to claim 1, wherein the micro motion platform further comprises a displacement sensor arranged at an end part of a feed direction of the core platform.

9. The linear motor assembly according to claim wherein the displacement sensor is a differential capacitance sensor or a photoelectric sensor.

10. The linear motor assembly according to claim 8, wherein an insulating layer is arranged on a non-working surface of the displacement sensor.

\* \* \* \* \*